(12) United States Patent
McCoy

(10) Patent No.: US 10,295,606 B2
(45) Date of Patent: May 21, 2019

(54) SYSTEM AND METHODS FOR DETECTION OF INTERNAL SHORTS IN BATTERIES

(71) Applicant: TIAX LLC, Lexington, MA (US)

(72) Inventor: Christopher H. McCoy, Sherborn, MA (US)

(73) Assignee: TIAX LLC, Lexington, MA (US)

( * ) Notice: Subject to any disclaimer, the term of this patent is extended or adjusted under 35 U.S.C. 154(b) by 298 days.

(21) Appl. No.: 14/206,668

(22) Filed: Mar. 12, 2014

(65) Prior Publication Data

US 2014/0266229 A1    Sep. 18, 2014

Related U.S. Application Data

(60) Provisional application No. 61/779,747, filed on Mar. 13, 2013.

(51) Int. Cl.
*G01R 31/02* (2006.01)
*G01R 31/36* (2019.01)
*G01R 31/385* (2019.01)
*G01R 31/396* (2019.01)

(52) U.S. Cl.
CPC ......... *G01R 31/385* (2019.01); *G01R 31/025* (2013.01); *G01R 31/396* (2019.01); *G01R 31/36* (2013.01); *G01R 31/3865* (2019.01)

(58) Field of Classification Search
CPC .............. G01R 31/3658; G01R 31/025; G01R 31/3627
USPC ........................................................ 320/134
See application file for complete search history.

(56) References Cited

U.S. PATENT DOCUMENTS

| | | | | |
|---|---|---|---|---|
| 5,945,805 | A * | 8/1999 | Takei | G01R 19/16542 320/124 |
| 6,097,172 | A * | 8/2000 | Podrazhansky | H02J 7/0093 320/107 |
| 6,255,803 | B1 * | 7/2001 | Ishihara | G01R 31/3835 320/134 |
| 6,268,710 | B1 * | 7/2001 | Koga | G01R 31/3624 320/116 |

(Continued)

FOREIGN PATENT DOCUMENTS

| | | |
|---|---|---|
| CN | 1174441 | 2/1998 |
| CN | 1821801 | 8/2006 |

(Continued)

OTHER PUBLICATIONS

International Search Report; International Application No. PCT/US14/23023; International Filing Date: Mar. 11, 2014; dated Jun. 16, 2014; 4 pages.

(Continued)

*Primary Examiner* — David V Henze-Gongola
*Assistant Examiner* — Tarikh Kanem Rankine
(74) *Attorney, Agent, or Firm* — Cantor Colburn LLP

(57) ABSTRACT

A method for short detection in a battery pack, the battery pack including a plurality of cells, the method including: connecting a short detection module to the battery pack; determining by the short detection module that the battery pack is at rest; and selecting a first cell in the battery pack for testing for a short, wherein the testing includes: connecting a voltage source to the first cell; measuring a current of the first cell; and determining based on the measured current of the first cell whether the first cell contains a short.

20 Claims, 5 Drawing Sheets

(56) References Cited

U.S. PATENT DOCUMENTS

| | | | | |
|---|---|---|---|---|
| 6,361,678 B1* | 3/2002 | Childs | ................... | C25B 15/06 |
| | | | | 204/222 |
| 6,420,852 B1* | 7/2002 | Sato | ................... | H01M 10/425 |
| | | | | 320/134 |
| 6,489,750 B2* | 12/2002 | Hebding | ............... | H02J 7/0052 |
| | | | | 320/139 |
| 7,683,575 B2* | 3/2010 | Berdichevsky | ..... | H01M 10/425 |
| | | | | 320/122 |
| 7,848,072 B2 | 12/2010 | Cordes et al. | | |
| 8,463,562 B2* | 6/2013 | Nakanishi | ............... | B60L 3/0046 |
| | | | | 320/120 |
| 2002/0146617 A1* | 10/2002 | Johnson | ................ | B64G 1/425 |
| | | | | 429/50 |
| 2003/0006735 A1* | 1/2003 | Kawakami | ........... | G01R 31/361 |
| | | | | 320/133 |
| 2004/0135544 A1* | 7/2004 | King | ..................... | B60L 11/185 |
| | | | | 320/116 |
| 2004/0189250 A1* | 9/2004 | Nishida | ................ | H02J 7/0024 |
| | | | | 320/116 |
| 2006/0186859 A1* | 8/2006 | Fujikawa | ............ | G01R 31/025 |
| | | | | 320/134 |
| 2006/0210843 A1* | 9/2006 | Masse | ............... | H01M 8/04305 |
| | | | | 429/90 |
| 2008/0252257 A1* | 10/2008 | Sufrin-Disler | ........ | B60L 3/0046 |
| | | | | 320/118 |
| 2009/0160453 A1* | 6/2009 | Tiihonen | .............. | G01R 31/025 |
| | | | | 324/509 |
| 2009/0167312 A1* | 7/2009 | Keates | ................ | G01R 31/025 |
| | | | | 324/434 |
| 2010/0188050 A1* | 7/2010 | Asakura | ............... | G01R 31/025 |
| | | | | 320/136 |
| 2011/0115442 A1 | 5/2011 | Garrastacho et al. | | |
| 2011/0148426 A1 | 6/2011 | Yokotani | | |
| 2011/0181246 A1* | 7/2011 | Tae | ........................ | H02J 7/0014 |
| | | | | 320/118 |
| 2011/0298417 A1* | 12/2011 | Stewart | ................ | G01R 31/025 |
| | | | | 320/107 |
| 2012/0139553 A1* | 6/2012 | Nortman | ............... | H02J 7/0016 |
| | | | | 324/537 |
| 2012/0182021 A1* | 7/2012 | McCoy | ................. | G01R 31/382 |
| | | | | 324/433 |
| 2013/0088201 A1* | 4/2013 | Iwasawa | ............. | H01M 10/441 |
| | | | | 320/118 |
| 2013/0179012 A1* | 7/2013 | Hermann | .............. | B60L 3/0046 |
| | | | | 701/22 |

FOREIGN PATENT DOCUMENTS

| | | | | |
|---|---|---|---|---|
| JP | | 2010231948 | 10/2010 | |
| JP | WO 2012164761 A1 * | | 12/2012 | .......... B60L 11/1866 |

OTHER PUBLICATIONS

Written Opinion of the International Searching Authority; International Application No. PCT/US14/23023; International Filing Date: Mar. 11, 2014; dated Jun. 16, 2014; 8 pages.

Japanese Office Action, Japanese Patent Application No. 2016-501128, dated Dec. 5, 2017; JP Office Action 4 pages, Office Action English Translation 4 pages.

* cited by examiner

SYSTEM AND METHODS FOR DETECTION OF INTERNAL SHORTS IN BATTERIES

CROSS-REFERENCE TO RELATED APPLICATION

This application is a non-Provisional application of Provisional Application No. 61/779,747, filed on Mar. 13, 2013, which is herein incorporated by reference in its entirety.

BACKGROUND (1) Technical Field

This disclosure relates generally to the field of monitoring of battery characteristics, and more particularly to battery monitoring for the purpose of detecting internal short circuits in one or more cells of a battery.

(2) Description of the Related Art

Batteries, or battery packs, are made of one or more cells, which may be, for example, lithium-ion cells, lithium-air cells, or lithium-metal based cells, and are used to power many different types of devices. Catastrophic failures of batteries have resulted in large-scale recalls costing hundreds of millions of dollars and in significant damage to company reputation and brand image. As the energy content of batteries continues to rise, the potential for serious failures becomes a major concern. Catastrophic battery failure may include a thermal runaway event in which an internal short circuit inside a cell initiates a self-accelerating decomposition reaction inside the cell. Thermal runaway events may include smoke, flames, or even an explosion if intervention is not performed in a timely manner.

Several different approaches are available to detect short circuits in cells by monitoring cell or cell block voltages. In these approaches, cell or cell block voltage changes are monitored when no charging or discharging is taking place in the cell in order to detect a drop in voltage across the cell that may be associated with an internal short circuit. Monitoring of cell voltage over time while a cell is at rest (i.e., when there is no charge or discharge current flowing in the cell) is used in the lithium-based cell industry by cell manufacturers as a quality control test. Following assembly of the cell and initial charging, cells are left at rest for a period of time and cell voltage is monitored. A decline in cell voltage beyond a certain value can indicate the presence of an internal short in the cell, thus allowing the cell to be rejected as faulty. Such voltage tests do not identify cells that will develop internal short circuits later in their life cycle, which may lead to catastrophic failures of cells that develop internal short circuits during operation. Further, monitoring of cell voltage when a cell is at rest has a relatively low sensitivity with respect to detection of internal shorts because an internal short may require an extended period of time to have a sufficiently large impact on cell voltage to allow unambiguous confirmation of whether an internal short is present in the cell. If a short is allowed to develop too far, a point-of-no-return may be reached where it is no longer possible to avoid thermal runaway and catastrophic cell failure.

SUMMARY

A relatively low cost system to detect internal short circuits in batteries is provided, that is applicable to cells configured in any manner within a battery, including cells configured as a series string of individual cells. In one embodiment, internal shorts are diagnosed by equilibrating a voltage source with a cell during periods where the battery is at rest, and monitoring current flow over a diagnostic period. A stable, zero-current condition indicates a normal, short-free cell. Non-zero, increasing current diagnoses the presence of an internal short. In another embodiment, a voltage source is equilibrated with a cell, disconnected for a time, and then reconnected, with a current surge into the cell indicating the presence of an internal short, and near-zero current indicating a normal cell.

Disclosed is a method for short detection in a battery pack, the battery pack including a plurality of cells, the method including: connecting a short detection module to the battery pack; determining by the short detection module that the battery pack is at rest; and selecting a first cell in the battery pack for testing for a short, wherein the testing includes: connecting a voltage source to the first cell; measuring a current of the first cell; and determining based on the measured current of the first cell whether the first cell contains a short.

Also disclosed is a system for short detection in a battery pack including a plurality of cells, including: a cell addressing matrix and control configured to be connected to the battery pack such that each of the plurality of cells is addressed separately for testing; a voltage source and a current measurement module configured to be connected to the plurality of cells via the cell addressing matrix and control; a control logic configured to determine whether a cell of the plurality of cells contains a short based on input from the current measurement module.

BRIEF DESCRIPTION OF THE DRAWINGS

Referring now to the figures, which are exemplary embodiments, and wherein the like elements are numbered alike.

DETAILED DESCRIPTION

Figure 1A:
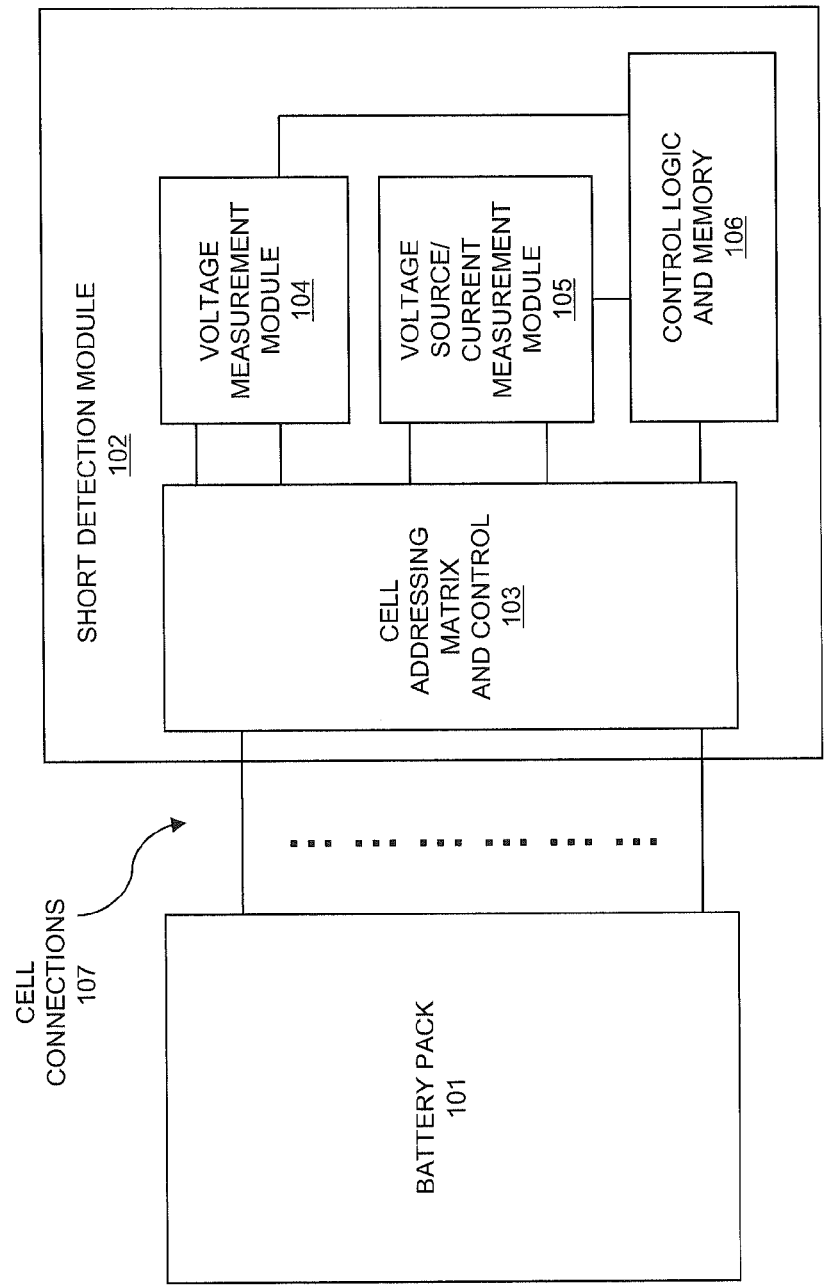
FIG. 1A illustrates an embodiment of a system for short detection.
Figure 1B:
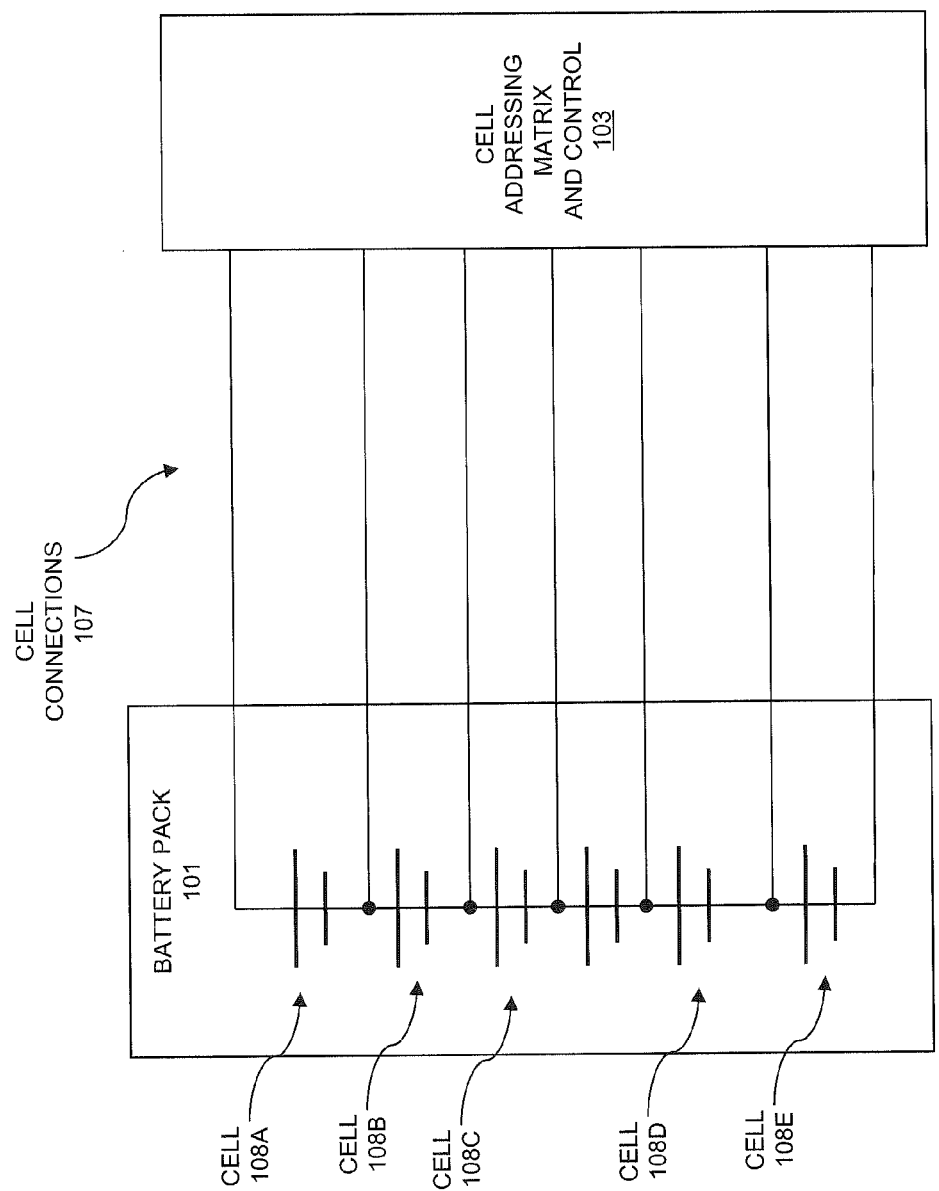
FIG. 1B illustrates an embodiment of cell connections and a battery pack.

Embodiments of systems and methods for detection of internal short circuits in batteries are provided, with exemplary embodiments being discussed below in detail. The invention utilizes the characteristic of lithium-ion cells, lithium-air cells, or lithium-metal based cells that in a normal, short-free cell, once current flow has ceased and the cell is at rest, cell voltage begins to relax to its equilibrium value, and once it has reached that equilibrium value, cell voltage is very stable. Because the aforementioned behavior applies to a single cell, a group of cells connected in parallel, a group of cells connected in series, or a group of cells with both series and parallel connections, the invention can be applied to any of the cell arrangements utilized in batteries. As shown in system 100 of FIG. 1A, hardware elements of a short detection module 102 include (1) a cell addressing matrix and control 103 to connect and disconnect individual cells or groups of cells of a battery pack 101 to and from a voltage measurement module 104 and to and from a voltage source/current measurement module 105, thereby allowing multiplexing of voltage measurement, voltage source, and current measurement resources across a plurality of cells, (2)

a voltage measurement module 104, and (3) voltage source/current measurement module 105 that includes a controllable voltage source that can be set to a desired value and a means to measure current flow from that voltage source. Methods to test for, diagnose, and quantify internal short circuits in cells are also provided FIG. 1A shows an embodiment of a system 100 for short detection. Battery pack 101 may comprise any appropriate number and configuration of lithium-ion cells, lithium-air cells, or lithium-metal based cells. In various embodiments, the cells in battery pack 101 may be in parallel, series, or a combination of parallel and series. The cells in battery pack 101 are connected to cell addressing matrix and control 103 in short detection module 102 via cell connections 107. Cell connections 107 may have any appropriate configuration and number based on the number and configuration of the cells in battery pack 101. The configuration of cell connections 107 may also depend on the type of testing performed by short detection module 102. In some embodiments, single cells in battery pack 101 may be tested by short detection module 102; in other embodiments, blocks of cells in battery pack 101 may be tested by short detection module 102. An example of cell connections 107 and a battery pack 101 comprising 5 series-connected cells 108A-E is shown in FIG. 1B that is configured for testing each of the 5-series-connected cells individually; however, this is shown for illustrative purposes only. Cell addressing matrix and control 103 connects and disconnects a voltage measurement module 104 and a voltage source/current measurement module 105 to the cell or block of cells that are being tested in battery pack 101. Cell addressing matrix and control 103 is used to select the cell or group of cells to be tested for internal shorts. In this way, voltage measurement and voltage source resources in the short detection module 102 can be multiplexed across a large number of cells in a battery pack 101.

The voltage source in voltage source/current measurement module 105 may be of any appropriate type that generates a voltage that is regulated to a target voltage at the output, including linear and switch-mode voltage regulation. Such voltage sources that may be used in in voltage source/current measurement module 105 include linear regulators in which a series pass element is controlled in a feedback loop to maintain a target output voltage, linear regulators in which a shunt element is controlled in a feedback loop to maintain a target output voltage, or a switch-mode regulator (DC-DC convertor, including a boost (step-up) convertor, buck (step-down) convertor, or inverting (output polarity opposite input polarity) convertor. The voltage source in voltage source/current measurement module 105 has an output voltage that may be controlled such that the output voltage can be set, and varied, as required. This control can be accomplished by means including, but not limited to, analog and/or digital control inputs. Other means of control may also be employed that deliver functional equivalence. For example, the voltage output of some voltage regulators (both linear and switch-mode) can be controlled via a programming resistor, which serves as part of a circuit that ultimately delivers a voltage or current to the regulator that sets output voltage of the regulator (i.e., the programming resistor provides an analog control signal).

The current measurement device in voltage source/current measurement module 105 may comprise any appropriate current measurement device, including but not limited to: a sense resistor placed in the current path where the voltage across the sense resistor is used to determine the magnitude of current flowing in the current path; a sense resistor with amplification, where the voltage drop across the sense resistor is amplified to allow for a small voltage loss dropped across the sense resistor but a larger amplitude signal proportional to current; or a current transducer of the Hall Effect, flux gate, or other family of current transducer providing a voltage output related to measurement of a target current. The current measuring device in voltage source/current measurement module 105 may be any appropriate current measuring devices, including but not limited to Hall Effect transducers, current sense resistors, induction sensors, current shunts, or current sense resistors with amplification. A current sense resistor with amplification includes a current sense resistor and amplification hardware so that the voltage drop across the current sense resistor may be kept relatively small (i.e., so that the insertion loss resulting from the sense resistor is relatively small), while the amplification hardware outputs a relatively large magnitude output voltage signal that is related to the current flowing through the current sense resistor for analysis.

Figure 2:
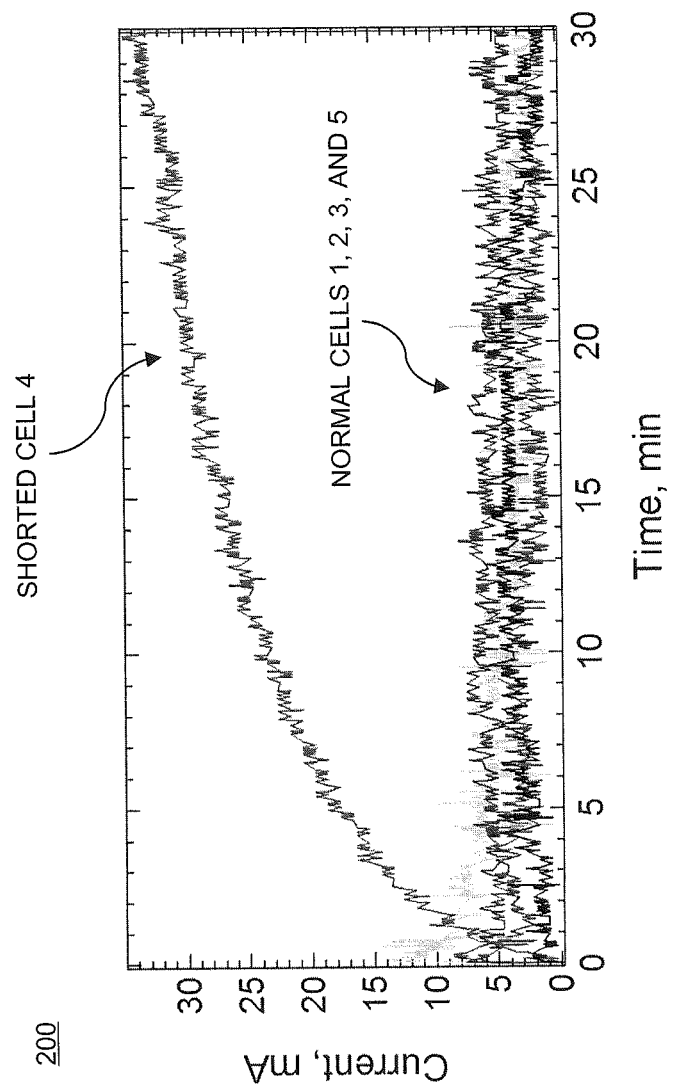
FIG. 2 illustrates an embodiment of measured current for a plurality of cells in a battery pack.

FIG. 2 shows an example graph 200 of measured current for a plurality of cells in a battery pack. A voltage source was applied to each cell of a five-cell battery pack and adjusted for approximately zero current at the beginning of the test of each cell. Current was monitored for a period of 30 minutes. A 100 ohm load, placed across cell 4 of the battery, was used to simulate a 100 ohm internal short in cell 4. As seen in the graph 200, the current flowing into cell 4 increases over time in the cell with the 100 ohm simulated short, whereas current for the other cells is relatively constant at a low value, or decays to a low value over the course of the 30 minute test.

Figure 3:
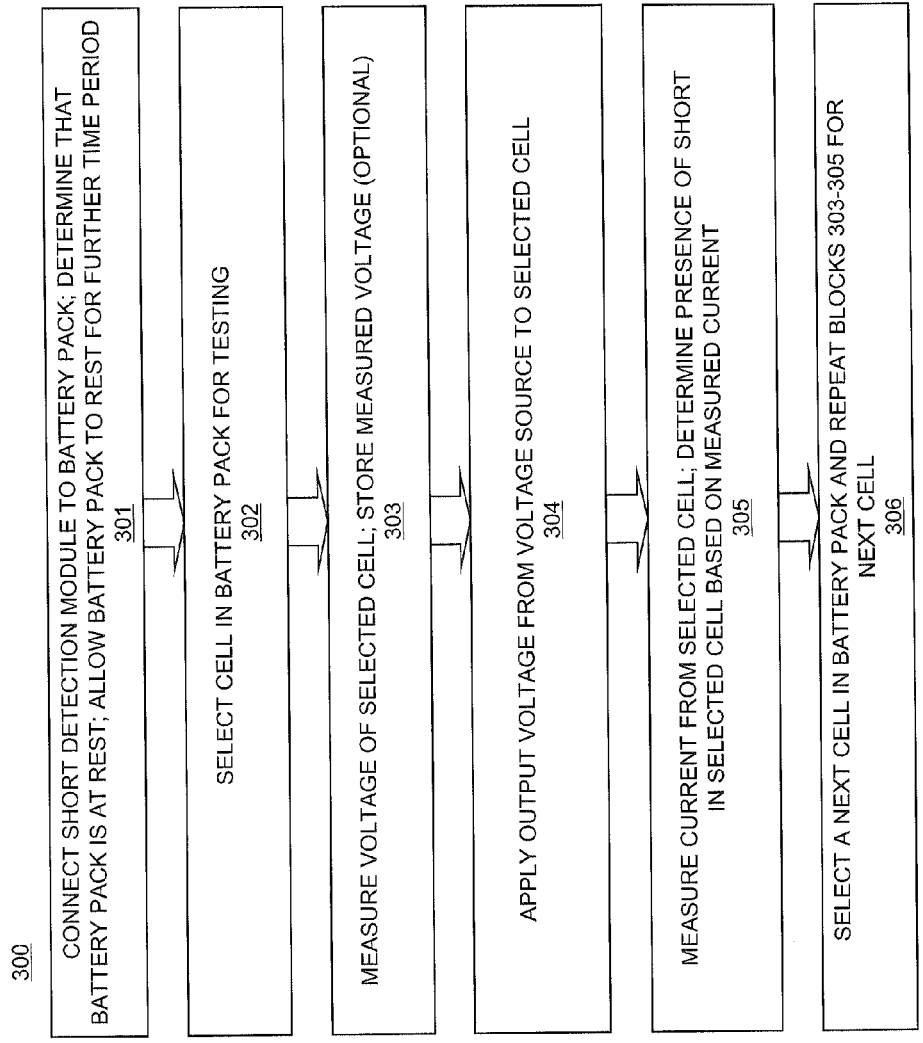
FIGS. 3 and 4 illustrate embodiments of methods for short detection.

An embodiment of a method 300 for short detection is shown in FIG. 3. FIG. 3 is discussed with respect to FIG. 1A. First, in block 301, the short detection module 102 is connected to the battery pack 101 via cell connections 107, and once it is observed that the battery pack 101 is at rest (i.e. no external current is flowing into or out of the battery), the battery pack 101 is allowed to continue to rest for a period of time sufficient, based on knowledge of the specific battery chemistry and cell characteristics, to consider the battery substantially equilibrated to the zero-current condition. Next, in block 302, a cell (or block of cells, if the battery pack 101 pack is so-configured) in the battery pack 101 is selected by cell addressing matrix and control 103 for evaluation for internal shorts. Then, in block 303, a measurement of cell voltage of the selected cell in battery pack 101 is made by voltage measurement module 104 via cell addressing matric and control 103, and the measured voltage for the selected cell is stored in control logic and memory 106. In some embodiments, block 303 may be optional; this is discussed in further detail below. Next, in block 304, voltage source/current measurement module 105 is set to output an output voltage, and the output voltage is applied to the selected cell. In some embodiments, the voltage source/current measurement module 105 is set to output the voltage value that was stored in control logic and memory 106 for the selected cell in battery back 101 in block 303, and the output voltage from the voltage source/current measurement module 105 is applied to the selected cell in battery pack 101. In some embodiments, during block 304, at the time of initial connection of the voltage source/current measurement module 105 to the selected cell, current flow from the selected cell may be trimmed to zero (or near-zero) by adjustment of the voltage value that is output by the voltage source/current measurement module 105. Then, in block 305, with the voltage source/current measurement module 105 connected to the selected cell, the current flow from the selected cell is monitored by voltage source/current measurement module 105 for a period of time to determine whether current is essentially stable at a near-zero value (indicative of a normal, short-free cell), or if the current flow from the selected cell increases over time, indicating that charging is required to offset internal losses due to an internal short circuit, and that the cell therefore contains an internal short circuit. Control logic and memory 106 may indicate whether the selected cell is normal or contains a short based on the current measurement of the selected cell by voltage source/current measurement module 105. Flow then proceeds to block 306, in which a next cell (or block of cells) in battery pack 101 is selected for testing by cell addressing matrix and control 103. Blocks 303, 304, and 305 are repeated for the next cell, and another cell may be selected for testing in block 306 until all cells (or blocks of cells) in the battery pack 101 have been tested for shorts.

In another embodiment of method 300, the measurement of cell voltage described with respect to block 303 is not performed. In such an embodiments, in block 304, the voltage source in voltage source/current measurement module 105 is connected to the cell and the output voltage of the voltage source in voltage source/current measurement module 105 varied to minimize the current flow from the cell that is measured by the current measurement module in voltage source/current measurement module 105. Once a minimized current flow from the selected cell is achieved, the output current of the selected cell may be observed as is described with respect to block 305. In such an embodiment, during the period in which the voltage source of voltage source/current measurement module 105 is applied to the selected cell and is being adjusted, that current flow from the voltage source be limited to a relatively low value so as not to perturb the selected cell needlessly from its rest state. In such an embodiment, memory voltage measurement module 104 may be omitted from short detection module 102 that is shown in FIG. 1.

Method 300 of FIG. 3 may be utilized for testing of single cells (or single blocks of parallel cells) or to test any number of series-connected cells (or blocks of cells) as a unit. For example, four cells connected in series within a battery could be tested as a single unit in the same manner in which a single cell is tested.

To reduce the total time required to test all cells in a battery using method 300, simultaneous testing of cells (or groups of cells) in battery pack 101 may be performed. However, various considerations may apply, given that cells in a battery are not electrically isolated from one another. Approaches to manage this lack of isolation may include: the use of galvanically isolated voltage sources, allowing testing of up to every cell in the pack simultaneously, if desired; and the testing of a set of series cells simultaneously with non-isolated voltage sources (the voltage source thus needing to provide the appropriate voltages referenced to series-connected cells, e.g. testing three cells in series with each at 4V would require a voltage source providing a 0, 4, 8, and 12V precision output).

The complexity of the hardware in short detection module 102 is increased as the number of cells in a battery pack 101 that are tested simultaneously is increased; however, this is a trade-off with regard the time required to test all cells in battery pack 101. For example, a reasonable diagnostic period to allow the battery pack 101 to rest in block 301 might be on the order of 30 minutes per cell. For low voltage packs, this is not necessarily an issue, but in, for example, a battery electric vehicle (BEV) pack of 80 cells, 40 hours would be required to scan through all cells. Thus, configuring short detection module 102 to scan more than one cell simultaneously may be desired for some applications.

Figure 4:
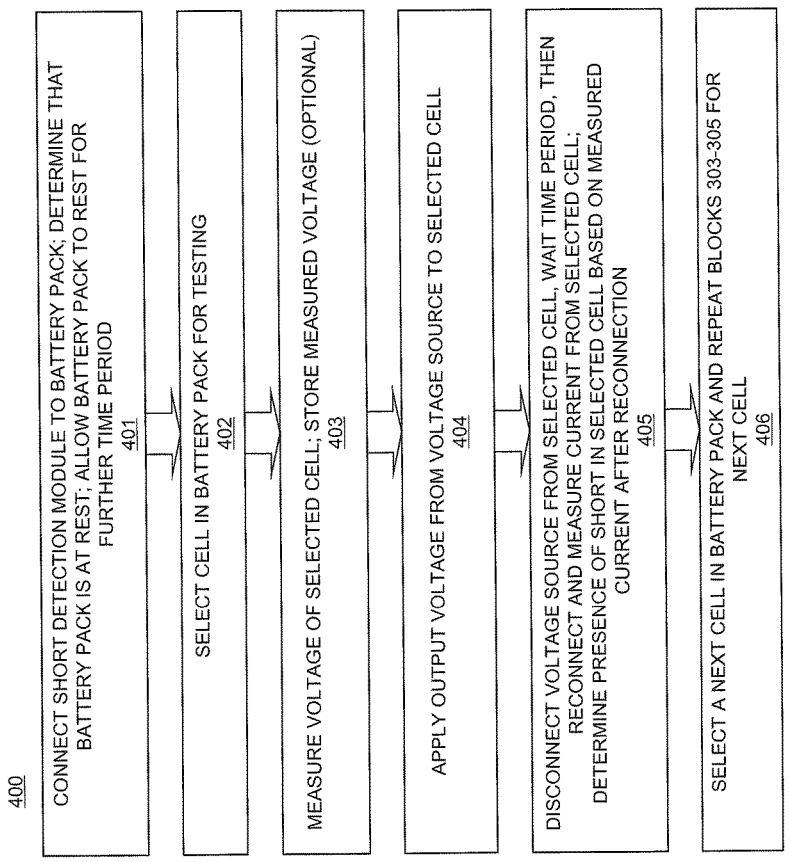

Another embodiment of a method 400 for short detection is shown in FIG. 4. FIG. 4 is discussed with respect to FIG. 1A. First, in block 401, the short detection module 102 is connected to the battery pack 101 via cell connections 107, and once it is observed that the battery pack 101 is at rest (i.e. no external current is flowing into or out of the battery), the battery pack 101 is allowed to continue to rest for a period of time sufficient, based on knowledge of the specific battery chemistry and cell characteristics, to consider the battery substantially equilibrated to the zero-current condition. Next, in block 402, a cell (or block of cells, if the battery pack 101 pack is so-configured) in the battery pack 101 is selected by cell addressing matrix and control 103 for evaluation for internal shorts. Then, in block 403, a measurement of cell voltage of the selected cell in battery pack 101 is made by voltage measurement module 104 via cell addressing matric and control 103, and the measured voltage for the selected cell is stored in control logic and memory 106. In some embodiments, block 403 may be optional; this is discussed in further detail below. Next, in block 404, voltage source/current measurement module 105 is set to output an output voltage, and the output voltage is applied to the selected cell. In some embodiments, the voltage source/current measurement module 105 is set to output the voltage value that was stored in control logic and memory 106 for the selected cell in battery back 101 in block 403, and the output voltage from the voltage source/current measurement module 105 is applied to the selected cell in battery pack 101. In other embodiments, the voltage output may be varied to minimize the current flow from the selected cell. In some embodiments, during block 304, at the time of initial connection of the voltage source/current measurement module 105 to the selected cell, current flow from the selected cell may be trimmed to zero (or near-zero) by adjustment of the voltage value that is output by the voltage source/current measurement module 105. Then, in block 405, the voltage source/current measurement module 105 is disconnected from the selected cell for a period of time, then the selected cell and voltage source/current measurement module 105 are reconnected, and the current flow from the selected cell is measured by voltage source/current measurement module 105 after reconnection. If the measured current from the selected cell after reconnection between the selected cell and voltage source/current measurement module 105 is stable and near-zero, a short-free condition is indicated for the selected cell. A transient spike in the measured current from the selected cell upon reconnection between the selected cell and voltage source/current measurement module 105 indicates the presence of an internal short circuit. Flow then proceeds to block 406, in which a next cell (or block of cells) in battery pack 101 is selected for testing by cell addressing matrix and control 103. Blocks 403, 404, and 405 are repeated for the next cell, and another cell may be selected for testing in block 406 until all cells (or blocks of cells) in the battery pack 101 have been tested for shorts.

In the embodiment described by method 400 of FIG. 4, sufficient precision control of the voltage source in voltage source/current measurement module 105 allows relatively rapid polling of each cell in battery pack 101 to determine its voltage. The short detection module 102 may then wait for the diagnostic period and relatively rapidly poll the cells in battery pack 101 again, setting the voltage source in voltage source/current measurement module 105 to the stored voltage value for each cell. This may require relative precision in the programmability of the voltage source in voltage source/current measurement module 105. Voltage source/current measurement module 105 may comprise an integrated circuit in some embodiments.

Over the course of testing cells for the presence of internal shorts as is described in FIGS. 3 and 4, the battery must remain at rest (i.e., no external current must flow either into, or out of, the battery). Given that current flow to and from a lithium-ion battery may be monitored for a variety of purposes by the battery management system (e.g., to carry out coulometry to determine state-of-charge and for safety to prevent over-current conditions), it is a simple matter to confirm that no external current was present during testing for internal shorts using methods of the invention. It should be noted that if, during the process of testing cells of a battery for internal shorts using methods of the invention, current flow to or from the battery is detected, the diagnostic tests for internal shorts of the invention can be suspended and resumed at the next opportunity when the battery is observed to be at rest. Any tests invalidated by presence of current flow into or out of the battery may be repeated at the next opportunity.

Some embodiments of a short detection module 102 as is shown in FIG. 1A may comprise a stand-alone system that is part of overall monitoring and management for a battery system, where the stand-alone system provides all required elements of the invention, including separate, dedicated wiring to the cells of the battery. In other embodiments, a short detection module 102 as is shown in FIG. 1A may be integrated with a battery management architecture where the battery management system and the system of the invention share cell voltage measurement capability and cell voltage sense wiring (which are required for standard lithium-ion battery management anyway) as common resources. Memory, control logic, and communications (e.g. to a host or other system) functions afforded by the standard battery management system may also be utilized by the invention as shared resources. In further embodiments, a short detection module 102 as is shown in FIG. 1A may comprise a stand-alone diagnostic instrument (e.g. handheld, benchtop) that can be used to test cells in a battery pack for internal shorts.

The disclosed embodiments may be embodied in many different forms, and this disclosure should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for short detection in a battery pack, the battery pack comprising a plurality of cells, the method comprising:
   connecting a short detection module to the battery pack;
   determining by the short detection module that the battery pack is at rest; and
   selecting a first cell in the battery pack for testing for a short, wherein the testing comprises:
      connecting a voltage source to the first cell, while the first cell is connected within the battery pack, the voltage source configured to provide a variable output that can be regulated to a target value, and the voltage source being configured to vary an output, when first connected to the first cell, to minimize current between the voltage source and the first cell;
      regulating the output of the voltage source to an equilibrated voltage of the first cell to achieve a regulated output;
      maintaining the regulated output;
      measuring a current of the first cell arising from application of the regulated output; and
      determining, based on the measured current of the first cell over time, whether the first cell contains a short.

2. The method of claim 1, further comprising, before connecting the voltage source to the first cell:
   measuring a voltage of the first cell, and storing the measured voltage; and
   setting a voltage source to output the stored measured voltage.

3. The method of claim 1, further comprising varying an output voltage of the voltage source to achieve a minimum current from the first cell after connecting the voltage source to the first cell; and determining based on the measured current of the first cell whether the first cell contains a short after achieving the minimum current from the first cell.

4. The method of claim 1, wherein the plurality of cells in the battery pack are connected in parallel.

5. The method of claim 1, wherein the plurality of cells in the battery pack are connected in series.

6. The method of claim 1, wherein the plurality of cells in the battery pack are connected in a combination of parallel and series.

7. The method of claim 1, wherein the first cell comprises a block of cells in the battery pack.

8. The method of claim 1, wherein the plurality of cells comprises one of lithium-ion cells, lithium-air cells, and lithium-metal based cells.

9. The method of claim 1, wherein the first cell is determined to contain a short based on a measured current that increases over time, and wherein the first cell is determined to not contain a short based on a measured current that is stable over time.

10. The method of claim 9, further comprising selecting a second cell of the plurality of cells for testing.

11. The method of claim 10, wherein the battery pack is connected to the short detection module such that each of the plurality of cells is addressed separately for testing.

12. The method of claim 1, further comprising:
after connecting the voltage source to the first cell, disconnecting the voltage source from the first cell;
reconnecting the voltage source to the first cell; and
measuring the current of the first cell after reconnecting the voltage source to the first cell.

13. The method of claim 12, wherein the first cell is determined to contain a short based on a transient spike in the measured current after reconnecting the voltage source to the first cell.

14. A system for short detection in a battery pack comprising a plurality of cells, comprising:
a cell addressing matrix and control configured to be connected to the battery pack such that each of the plurality of cells is addressed separately for testing;
a voltage source and a current measurement module configured to be connected to the plurality of cells via the cell addressing matrix and control; and
a control logic configured to determine whether a cell of the plurality of cells contains a short based on input from the current measurement module, while the first cell is connected within the battery pack, wherein the control logic determines that the battery pack is at rest, wherein the voltage source is configured to provide: (i) a variable output when first connecting to the cell of the plurality of cells to minimize current between the voltage source and the cell of the plurality of cells and (ii) the variable output that can be regulated to a target value, the control logic configured to regulate an output of the voltage source to an equilibrated voltage of the cell to achieve a regulated output, maintain the regulated output, and measure a current of the cell over time arising from application of the regulated output.

15. The system of claim 14, wherein the system further comprises:
a memory configured to store a measured voltage for each of the cells of the plurality of cells; and
a voltage measurement module configured to be connected to the plurality of cells via the cell addressing matrix and control, and is configured to perform a method comprising:
selecting a first cell in the battery pack for testing for a short by the cell addressing matrix and control, wherein the testing comprises:
connecting the voltage measurement module to the first cell by the cell addressing matrix and control
measuring a voltage of the first cell by the voltage measurement module;
storing the measured voltage in the memory;
setting the voltage source to output the stored measured voltage;
connecting the voltage source and the current measurement module to the first cell by the cell addressing matrix and control;
measuring a current of the first cell by the current measurement module; and
determining based on the measured current of the first cell whether the first cell contains a short by the control logic.

16. The system of claim 14, wherein the system is configured to perform a method comprising:
selecting a first cell in the battery pack for testing for a short by the cell addressing matrix and control, wherein the testing comprises:
connecting the voltage source and the current measurement module to the first cell by the cell addressing matrix and control;
varying an output voltage of the voltage source to achieve a minimum current from the first cell after connecting the voltage source to the first cell; and
measuring a current of the first cell by the current measurement module; and
determining based on the measured current of the first cell whether the first cell contains a short by the control logic after achieving the minimum current from the first cell.

17. The system of claim 14, wherein a first cell is determined to contain a short based on a measured current that increases over time.

18. The system of claim 14, wherein a first cell is determined to not contain a short based on a measured current that is stable over time.

19. The system of claim 15, wherein the method further comprises:
after connecting the voltage source to a first cell, disconnecting the voltage source from the first cell by the cell addressing matrix and control;
reconnecting the voltage source to the first cell by the cell addressing matrix and control; and
measuring the current of the first cell by the current measurement module after reconnecting the voltage source to the first cell.

20. The system of claim 19, wherein the first cell is determined to contain a short based on a transient spike in the measured current after reconnecting the voltage source to the first cell.

* * * * *